United States Patent
Tamaura et al.

(10) Patent No.: US 9,739,504 B2
(45) Date of Patent: Aug. 22, 2017

(54) STEAM GENERATOR AND ENERGY SUPPLY SYSTEM USING THE SAME

(75) Inventors: Yutaka Tamaura, Tokyo (JP);
Yoshiharu Horita, Tokyo (JP); Koji Miyazaki, Kitakyushu (JP); Kazutaka Hiraoka, Yokoyama (JP); Toru Kannari, Osaka (JP)

(73) Assignees: TOKYO INSTITUTE OF TECHNOLOGY, Tokyo (JP); KYUSHU INSTITUTE OF TECHNOLOGY, Kitakyushu-shi (JP); JGC CORPORATION, Tokyo (JP); SASAKURA ENGINEERING CO., LTD., Osaka-shi (JP)

( * ) Notice: Subject to any disclaimer, the term of this patent is extended or adjusted under 35 U.S.C. 154(b) by 149 days.

(21) Appl. No.: 13/638,176

(22) PCT Filed: Dec. 3, 2010

(86) PCT No.: PCT/JP2010/071740
§ 371 (c)(1),
(2), (4) Date: Sep. 28, 2012

(87) PCT Pub. No.: WO2011/121852
PCT Pub. Date: Oct. 6, 2011

(65) Prior Publication Data
US 2013/0019598 A1    Jan. 24, 2013

(30) Foreign Application Priority Data

Mar. 31, 2010   (JP) ................................ 2010-083102

(51) Int. Cl.
*F03G 6/00*       (2006.01)
*F24J 2/07*       (2006.01)
(Continued)

(52) U.S. Cl.
CPC ................ *F24J 2/07* (2013.01); *F01K 25/10* (2013.01); *F22B 1/006* (2013.01); *H01L 35/30* (2013.01); *Y02E 10/41* (2013.01); *Y02E 10/46* (2013.01)

(58) Field of Classification Search
CPC ......... Y02E 20/16; Y02E 10/10; Y02E 10/41; Y02E 10/44; Y02E 10/46; Y02E 60/15;
(Continued)

(56) References Cited

U.S. PATENT DOCUMENTS 3,857,244 A * 12/1974 Faucette ................... F03G 7/04
                                                       165/45
4,461,223 A *  7/1984 Masaki ......................... 110/215
(Continued)

FOREIGN PATENT DOCUMENTS

JP      S54-80278      6/1979
JP      H10-9680       1/1998
(Continued)

OTHER PUBLICATIONS

International Search Report for International Application No. PCT/JP2010/071740 dated Feb. 8, 2011.

*Primary Examiner* — Mark Laurenzi
*Assistant Examiner* — Shafiq Mian
(74) *Attorney, Agent, or Firm* — Kratz, Quintos & Hanson, LLP

(57) ABSTRACT

The present invention provides a steam generator capable of greatly improving energy efficiency, and an energy supply system that uses the steam generator. The steam generator of the present invention includes a high-temperature chamber to which heat of 250° C. to 800° C. is supplied; a low-temperature chamber arranged adjacent to the high-temperature chamber and configured to produce low-temperature steam of 50° C. to 185° C. from water using the heat of the (Continued)

high-temperature chamber; and at least one thermoelectric element arranged between the high-temperature chamber and the low-temperature chamber.

10 Claims, 8 Drawing Sheets

(51) Int. Cl.
*F01K 25/10* (2006.01)
*F22B 1/00* (2006.01)
*H01L 35/30* (2006.01)

(58) Field of Classification Search
CPC ... F03G 7/04; F03G 6/00; F01K 23/06; F01K 26/06; F01K 27/00; F01K 27/02; F01K 25/10; F01K 3/00; F01K 3/004; F01K 3/008; F01K 3/02; F01K 13/02; F02C 6/16; F02G 1/0445; C02F 1/16; F24J 2/07
USPC ......... 60/520, 641.8, 641.15, 653, 654, 679, 60/652, 659, 641.1; 110/215, 234, 345; 122/5.52, 31.1; 136/202, 205, 225, 234, 136/239, 240
See application file for complete search history.

(56) References Cited

U.S. PATENT DOCUMENTS

| 5,047,654 | A  * | 9/1991  | Newman | F24J 2/07 290/52 |
| 5,232,516 | A  * | 8/1993  | Hed | H01L 35/30 136/203 |
| 5,400,599 | A  * | 3/1995  | Sekiya et al. | 60/520 |
| 6,269,645 | B1 * | 8/2001  | Yamaguchi | 60/653 |
| 7,685,820 | B2 * | 3/2010  | Litwin | F02C 1/05 60/641.11 |
| 8,614,390 | B2 * | 12/2013 | Watts | F24J 2/42 136/205 |
| 2004/0244376 | A1 * | 12/2004 | Litwin | F03G 6/064 60/641.8 |
| 2005/0126170 | A1 * | 6/2005  | Litwin | F03G 6/065 60/641.8 |
| 2006/0027257 | A1  | 2/2006  | Yamaguchi | |
| 2007/0119495 | A1 * | 5/2007  | Sumrall | H01L 35/00 136/205 |
| 2008/0041054 | A1 * | 2/2008  | Montesinos | F03G 6/003 60/641.8 |
| 2008/0066736 | A1 * | 3/2008  | Zhu | F03G 6/005 126/620 |
| 2008/0289335 | A1 * | 11/2008 | Drysdale | F01D 15/005 60/649 |
| 2010/0051450 | A1  | 3/2010  | Murahara | |
| 2010/0230071 | A1 * | 9/2010  | Slater | F24D 11/0221 165/45 |
| 2011/0041515 | A1 * | 2/2011  | Fraim | F28D 7/16 62/3.2 |
| 2011/0100611 | A1 * | 5/2011  | Ohler | F01K 3/00 165/104.28 |
| 2011/0226301 | A1 * | 9/2011  | Kershaw | H01L 35/30 136/206 |
| 2011/0266132 | A1 * | 11/2011 | Takezaki | B01D 1/0035 202/233 |
| 2012/0111386 | A1 * | 5/2012  | Bell | H01L 35/30 136/205 |

FOREIGN PATENT DOCUMENTS

| JP | 2004-160301 A1 | 6/2004 | |
| JP | 2005-27485 A1 | 1/2005 | |
| JP | 2005-279466 A1 | 10/2005 | |
| JP | 2006-50792 A1 | 2/2006 | |
| JP | 2007-150112 A1 | 6/2007 | |
| JP | WO 2010076841 A1 * | 7/2010 | .......... B01D 1/0035 |
| WO | WO 2008/142995 A1 | 11/2008 | |

* cited by examiner

STEAM GENERATOR AND ENERGY SUPPLY SYSTEM USING THE SAME

TECHNICAL FIELD

The present invention relates to a steam generator, and an energy supply system that uses the same.

BACKGROUND ART

Heretofore, various types of steam generators that produce steam from water have been proposed. For example, Patent Literature 1 discloses the production of steam by arranging multiple heat transfer tubes to which heat is supplied, and evaporating liquid supplied to the outer surface of the tubes.

CITATION LIST

Patent Literature

PLT 1: Japanese Unexamined Patent Publication No. S54-80278

SUMMARY OF INVENTION

Technical Problem

When steam produced by the above-described steam generator is used to generate power, high-temperature steam is produced using the heat of high temperature combustion, and this steam is used for power generation. Accordingly, power generation by known steam generators requires high-temperature steam, and a large amount of heat of combustion is therefore necessary. Consequently, these steam generators require a large energy load and have problems in terms of efficiency.

Accordingly, an object of the present invention is to provide a steam generator capable of greatly improving the energy efficiency, and an energy supply system that uses the steam generator.

Solution to Problem

The present invention includes a high-temperature chamber to which heat of 250° C. to 800° C. is supplied, a low-temperature chamber arranged adjacent to the high-temperature chamber and configured to produce low-temperature steam of 50° C. to 185° C. from water using the heat of the high-temperature chamber, and at least one thermoelectric element arranged between the high-temperature chamber and the low-temperature chamber.

This configuration allows the supply of power and the production of steam at the same time because the thermoelectric element is arranged between the high-temperature chamber and the low-temperature chamber so as to generate power by the temperature difference between the high-temperature chamber and the low-temperature chamber. Accordingly, the supplied heat can be effectively used. In particular, because the steam generator of the present invention produces low-temperature steam of 50° C. to 185° C., no further energy is needed, for example, no need to supply additional heat to the heat supplied from an outside heat source. Further, because the conversion efficiency of thermoelectric generation is high when the temperature difference is great, it is unnecessary to produce higher temperature steam than required. Accordingly, in the production of low-temperature steam of 50° C. to 185° C. as in the present invention, almost all of the supplied thermal energy can be converted into both usable electricity and steam for further applications. Accordingly, the energy efficiency can be greatly improved. Further, the thermoelectric element is generally maintenance-free, and it is possible to provide clean energy because the thermoelectric element does not generate noise or the like.

Although the heat to be supplied to the high-temperature chamber is not particularly limited in the above steam generator, it is preferable, for example, to supply a heat transfer medium in a liquid state. In this case, the high-temperature chamber may be formed of a passage to allow supply of the heat transfer medium thereto. In this way, the heat of the high-temperature chamber can be transmitted to the low-temperature chamber via the heat transfer medium. Various types of fluids can be employed as the heat transfer medium. For example, a heat transfer medium such as molten salt, oil, or the like can be used. Further, the use of a heat transfer medium in a liquid state allows the heat transfer medium to be circulated. Specifically, the heat transfer medium that was heat-exchanged in the high-temperature chamber can be returned to the high-temperature chamber after being heated by another heating device. The steam that was heat-exchanged in the low-temperature chamber is circulated in a similar manner: the steam can be returned to the low-temperature chamber after being condensed by another device. Specifically, both water and steam in the low-temperature chamber can be circulated as the heat transfer medium. Accordingly, it is possible to improve the energy efficiency. Further, when the high-temperature chamber is formed with a passage, for example, the passage inside a tubular member can serve as the high-temperature chamber, and the outside of the tubular member can serve as the low-temperature chamber. In this case, the thermoelectric element can be attached to an outer surface or an inner wall surface of the tubular member.

An energy supply system according to the present invention includes the above-described steam generator and a heat source supply device that supplies the heat transfer medium to the high-temperature chamber.

This system can be configured in such a manner that the heat transfer medium circulates between the heat source supply device and the high-temperature chamber. Further, the heat source supply device can heat the heat transfer medium that is returned thereto from the high-temperature chamber. In this way, the heat transfer medium can be efficiently used.

The above-described system can further include a heat exchanger to which the low-temperature steam is supplied and in which heat exchange is performed using the low-temperature steam. Because steam has a high latent heat content, low-temperature steam of 50° C. to 185° C. as in the present invention can be easily used in various applications such as heating, drying, evaporating, etc. Examples of the heat exchanger that uses low-temperature steam of 50° C. to 185° C. as in the present invention include various types of plants such as a chemical heat pump, a seawater desalination plant that desalinates seawater, and the like.

Electricity generated by the thermoelectric element can be used in various applications. For example, the electricity can be supplied to the heat exchanger and used as the power for driving the same. The power can also be supplied to an external device of the system of the present invention.

The above-described heat exchanger can produce water from the low-temperature steam by heat exchange, and can supply the produced water to the low-temperature chamber of the steam generator. In this way, the low-temperature steam circulates between the steam generator and the heat exchanger and is effectively used, further improving the energy efficiency.

In the above-described heat source supply device, heat can be produced by various methods. For example, the heat source supply device can be configured to use solar heat so as to heat the heat transfer medium. The environmental load can be significantly reduced by utilizing natural energy as described above. Further, because the stored natural energy can be effectively utilized without being lost to the outside, it is possible to further improve the energy efficiency of the entire system.

For example, the above-described heat source supply device may include a low-temperature tank that stores the heat transfer medium that passes through the high-temperature chamber of the steam generator; a solar collecting means that uses solar heat so as to heat the heat transfer medium supplied from the low-temperature tank; and a high-temperature tank that stores the heat transfer medium heated by the solar collecting means, and that supplies the heat transfer medium to the high-temperature chamber of the steam generator. In this way, the heat can be supplied either from the high-temperature tank or the low-temperature tank, and can be used in infrastructure for heating, cooling, etc.

The above-described system may further include a heat exchanger that produces steam by heat exchange with the heat transfer medium supplied from the high-temperature tank, a steam turbine driven by the steam produced by the heat exchanger, and a power generator driven by the steam turbine. Establishment of such a facility allows supply of large-scale power. In this way, basic social infrastructure such as water, heat, and electricity can be simultaneously provided.

Advantageous Effects of Invention

According to the steam generator and the energy supply system of the present invention, almost all of the stored energy is converted to effectively usable electricity and steam without being discharged to the outside, thus greatly improving the energy efficiency of the entire system.

DESCRIPTION OF EMBODIMENTS

Figure 1:
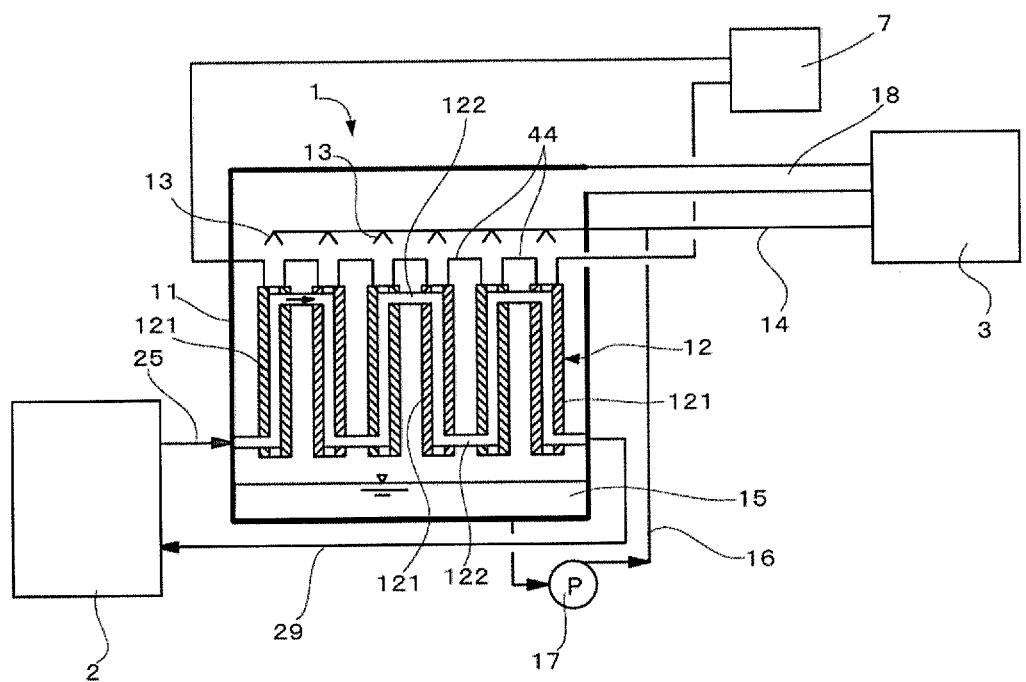
FIG. 1 is a schematic diagram of an embodiment of a steam generator and an energy supply system according to the present invention.

Hereinbelow, an embodiment of a steam generator and an energy supply system according to the present invention is described with reference to the drawings. FIG. 1 is a schematic diagram of the system.

As shown in FIG. 1, the energy supply system according to the present embodiment includes a steam generator 1 that produces steam, and a heat source supply device 2 that supplies heat thereto. Further, steam produced by the steam generator is supplied to a seawater desalination plant 3 that desalinates seawater. Hereinbelow, each device is described.

The steam generator 1 includes a housing 11 that houses a passage 12 through which a high-temperature heat transfer medium flows, and multiple spray nozzles 13 that spray water toward the passage 12. This passage 12 extends in an up-down direction, and is formed by interconnecting multiple pipe members 121 arranged in parallel to one another. In this example, the passage 12 that is bent in an up-down direction is formed by alternately connecting upper ends and lower ends of the adjacent pipe members 121 via connecting pipes 122. A thermoelectric element module 4 is attached on the surface of each pipe member 121. A description thereof is provided later. The spray nozzles 13 are arranged above each pipe member 121, connected to a supply tube 14 extending from outside of the housing 11, and are capable of uniformly spraying water to each pipe member 121.

The bottom of the housing 11 serves as a reservoir 15, where some of the water sprayed from the spray nozzles 13 is stored. The housing 11 has a discharge tube 16 connected to a lower portion thereof for discharging stored water, and the discharge tube 16 is connected to the above-described supply tube 14 via a circulation pump 17. Further, the housing 11 has a steam duct 18 provided at an upper portion thereof for discharging steam. The steam duct 18 is connected to the seawater desalination plant 3.

Figure 2:
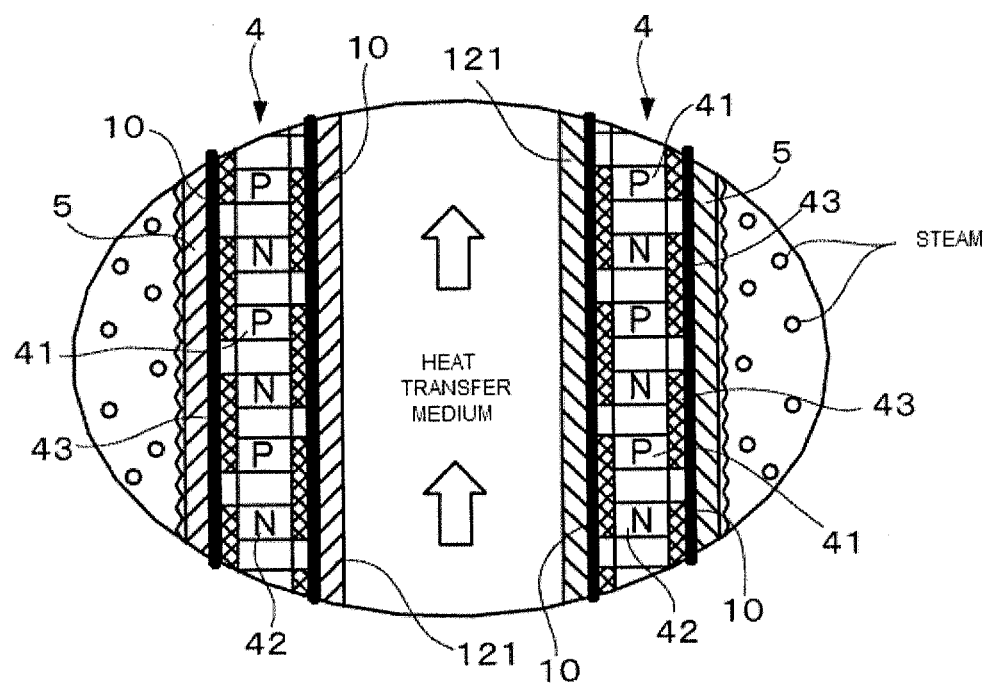
FIG. 2 is an enlarged cross sectional view of a pipe member shown in FIG. 1.

Next, the thermoelectric element module 4 is described with reference to FIG. 2. FIG. 2 is an enlarged cross sectional view of the pipe member. A known module can be used as the thermoelectric element module of the present embodiment. A general description thereof is as follows. As shown in FIG. 2, the thermoelectric element module 4 is arranged in the axial direction on the surface of each pipe member 121. Further, the surface of the thermoelectric element module 4 is covered with a heat transfer plate 5. Additionally, an electrical insulation material 10 such as ceramics or the like is arranged between the thermoelectric element module 4 and the pipe member 121, and also between the thermoelectric element module 4 and the heat transfer plate 5. The heat transfer plate 5 can be formed from a material having good thermal conductivity, such as, for example, copper, aluminum, iron, copper alloy, stainless steel, and like metals. Specifically, the thermoelectric element module 4 includes alternately arranged p-type thermoelectric elements 41 and n-type thermoelectric elements 42, and the adjacent thermoelectric elements 41 and 42 are connected in series via a conductor 43. Further, the thermoelectric element modules 4 of the pipe members 121 are interconnected in series via a conductive wire 44 (see FIG. 1). Specifically, a thermoelectric generation unit is formed by interconnecting in series the thermoelectric element modules 4 of the adjacent pipe members 121. The units are interconnected in series or in parallel. The units at the left and right ends are connected to a converter 7 arranged outside the housing 11 so as to allow power supply to the outside. Various types of materials can be used for forming the p-type thermoelectric elements 41 and the n-type thermoelectric elements 42. For example, Bi—Te-based materials (low temperature range), skutterudite-based materials (medium temperature range), and silicide-based materials (high temperature range) can be used in the corresponding temperature range. Note that, because the thermoelectric conversion materials that form the thermoelectric elements 41 and 42 have temperature-dependent properties, conversion in the wide temperature range using only one type of material is not necessarily preferable. Accordingly, several materials that each demonstrates high conversion efficiency in a specific temperature range can be used in combination. For example, a cascade module in which multiple modules are stacked can be used, or a thermoelectric unit most suitable for each temperature range can be used in the individual temperature ranges. Regardless of the system employed, the temperature difference between the lower temperature side and the high temperature side needs to be about 100° C. to 600° C., preferably 200° C. to 600° C.

Figure 3:
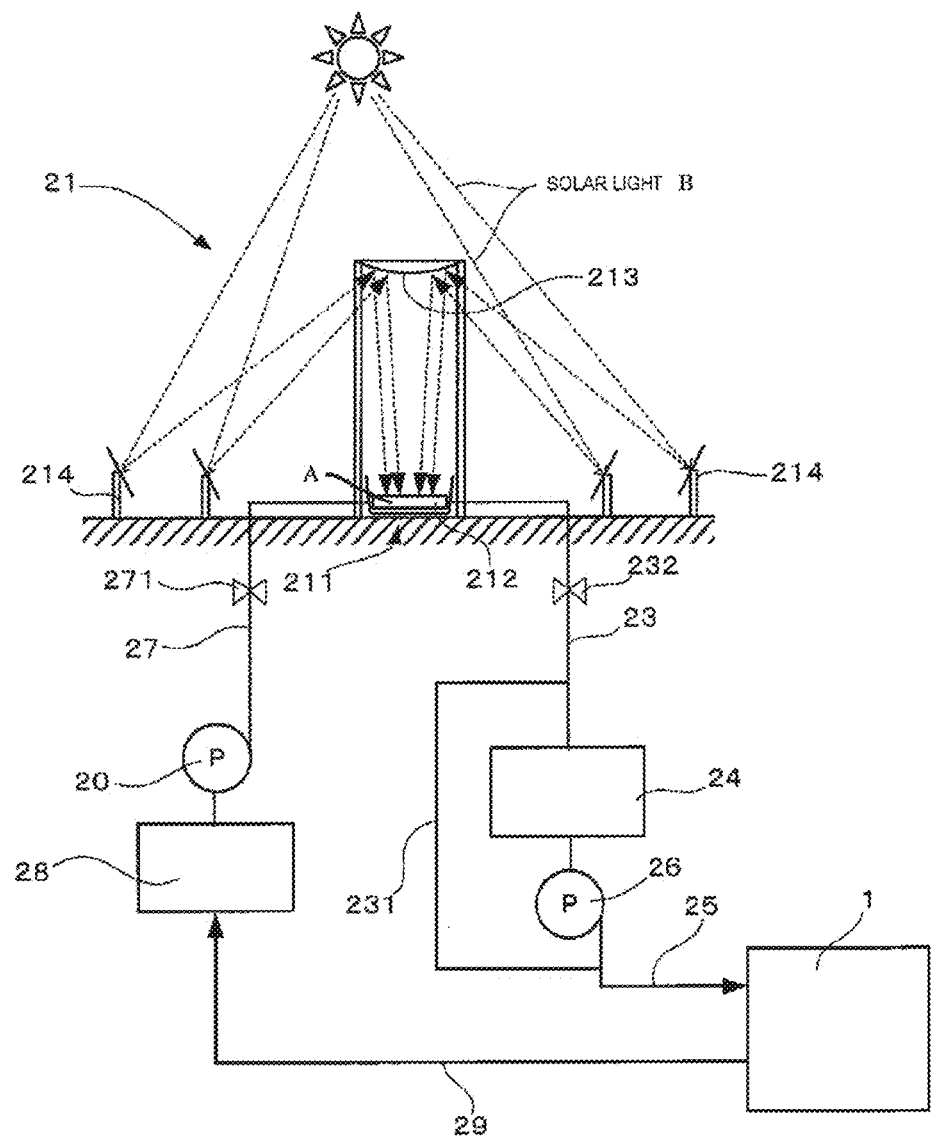
FIG. 3 is a schematic diagram of a heat source supply device.

Next, the heat source supply device 2 is described. FIG. 3 is a schematic diagram of the heat source supply device. As shown in FIG. 3, the heat source supply device 2 has a solar collecting system 21 that uses solar light B to heat the heat transfer medium A. Examples of usable solar collecting systems include known systems such as a trough system, Fresnel system, parabolic dish system, central receiver system, and the like. A tower or beam-down central receiver system is preferable for obtaining a greater amount of heat source having a higher temperature. In the present embodiment, the solar collecting system 21 having a beam-down central receiver is described as an example. More specifically, the solar collecting system 21 includes a heat collecting portion 211 and a heat collecting tube 212 extending therethrough. A central reflector 213 is provided above the heat collecting portion 211, and multiple heliostats 214 placed on the ground reflect light toward the central reflector 213. The light from the heliostats 214 is intensively reflected from the central reflector 213 toward the heat collecting portion 211, and the heat collecting portion 211 is irradiated with the light. The heat collecting tube 212 is formed with a known material having good thermal conductivity, and transmits heat from the light received by the heat collecting portion 211 to the heat transfer medium passing through the heat collecting tube 212. Note that molten salt, oil, or the like can be generally used as the heat transfer medium.

Further, the downstream side of the heat collecting tube 212, which is the side immediately following the heat collecting portion 211, is connected to a high-temperature tank 24 via a discharge pipe 23, and the heat transfer medium heated by the heat collecting portion 211 is stored in the high-temperature tank 24. The high-temperature tank 24 is connected to the upstream side of the passage 12 of the steam generator 1 via a supply pipe 25, and is capable of supplying the stored heat transfer medium to the steam generator 1 by a pump 26. The upstream side of the heat collecting tube 212, which is the side leading to the heat collecting portion 211, is connected to a low-temperature tank 28 via a supply pipe 27. The low-temperature tank 28 is connected to a downstream portion of the passage 12 of the steam generator 1 via a discharge pipe 29, and is capable of storing a low-temperature heat transfer medium from the discharge pipe 29. The stored low-temperature heat transfer medium can be supplied to the heat collecting tube 212 by a pump 20. Further, a bypass pipe 231 is arranged between the discharge pipe 23 and the supply pipe 25 in order to allow the heat transfer medium to be directly supplied from the discharge pipe 23 to the supply pipe 25 without passing through the high-temperature tank 24. Note that valves 232 and 271 are arranged on the upstream side of the discharge pipe 23 and the downstream side of the supply pipe 27, respectively, and the supply of the heat transfer medium to the solar collecting system 21 can thereby be controlled.

Next, the seawater desalination plant 3 is described. A known plant that desalinates seawater by evaporation techniques such as Multi Effect Desalination (MED), Multistage Flash (MSF), and the like can be used as the seawater desalination plant 3. In the present embodiment, the steam generator 1 and the seawater desalination plant 3 are interconnected via the steam duct 18, and low-temperature steam of 50° C. to 185° C. produced by the steam generator 1 is sent to the seawater desalination plant 3. The steam used in a desalination process is condensed, and the condensed water is introduced into the steam generator 1 via the supply tube 14.

Next, the operation of the energy supply system having the above-described configuration is described. First, in the heat source supply device 2, a heat transfer medium is supplied from the low-temperature tank 28 to the heat collecting tube 212 by the pump 20. Light reflected from the central reflector 213 toward the heat collecting portion 211 is transmitted as heat to the heat collecting tube 212. The heat of this light is transmitted to the heat transfer medium via the heat collecting tube 212, and heats the heat transfer medium. The heated heat transfer medium is stored in the high-temperature tank 24 via the discharge pipe 23, and supplied to the steam generator 1 by the pump 26. At this time, the temperature of the heat transfer medium to be supplied is preferably, for example, 250° C. to 800° C., further preferably 450° C. to 650° C. Note that the heat transfer medium can be directly supplied to the steam generator 1 via the bypass pipe 231 without being stored in the high-temperature tank 24.

The heat transfer medium discharged from the high-temperature tank 24 is supplied to the upstream side of the passage 12 of the steam generator 1 and discharged to the outside of the housing 11 through the passage 12. In this process, in the housing 11, water is sprayed from the spray nozzles 13 toward the pipe members 121. This water is heated on the surface of the heat transfer plate 5 by the high-temperature heat transfer medium passing through the pipe members 121, converted into steam F, and discharged to the outside of the housing 11. At this time, a temperature difference is generated on the surface of the pipe members 121 between the high-temperature heat transfer medium passing through the pipe members 121 and water sprayed toward the outside of the pipe members 121. Due to the temperature difference, power is generated by the thermoelectric elements 41 and 42 attached on the surface of the pipe members 121, and electric current is transmitted to the converter 7. Subsequently, this electric current is converted by the converter 7, allowing the power supply to the outside. Of the water sprayed, some portion that is stored in a bottom 15 of the housing 11 is discharged to the outside, returned to the supply tube 14 by the circulation pump 17, and again sprayed from the spray nozzles 13.

The heat transfer medium that passes through the steam generator 1 is stored in the low-temperature tank 28 of the heat source supply device 2 via the discharge pipe 29. Although it depends on the specification of the steam generator 1, the temperature at this time is, for example, 200° C. to 300° C. As described above, the heat transfer medium stored in the low-temperature tank 28 is again supplied to the heat collecting tube 212 by the pump 20.

Steam produced by the steam generator 1 is supplied to the seawater desalination plant 3 via the steam duct 18. This steam is low-temperature steam suitable for the seawater desalination plant 3, and the temperature thereof is preferably, for example, 50° C. to 185° C. When an ejector or the like is used in the seawater desalination plant 3, the temperature of the steam is preferably 140° C. to 185° C. In the seawater desalination plant 3, the introduced seawater is processed by an evaporation technique using the above-described low-temperature steam, and converted into desalinated water. Subsequently, the processed seawater is discharged, and the produced freshwater is stored in a tank (the figure is omitted). The low-temperature steam used in the desalination process is condensed in the seawater desalination plant 3, and introduced, as condensed water, into the supply tube 14 of the steam generator 1. The supply tube 14 is connected to the spray nozzles 13 and used for producing steam. The temperature of the condensed water is preferably, for example, 60° C. to 130° C.

As described above, according to the present embodiment, power can be generated by the temperature difference between the heat transfer medium and water because the steam generator 1 includes the thermoelectric element module 4 attached on the surface of each pipe member 121. Consequently, it is possible to supply power in addition to producing steam. Accordingly, the supplied heat can be effectively used. Further, because the heat source supply device 2 that supplies heat to the steam generator 1 uses solar heat, no waste is generated, achieving clean energy. Further, the low-temperature heat transfer medium discharged from the steam generator 1 is returned to the heat source supply device 2 for reuse, thus further improving the energy efficiency. Additionally, the low-temperature steam used in the seawater desalination plant 3 is condensed and used as condensed water in the steam generator 1. As described above, the energy supply system according to the present embodiment reuses heat-exchanged heat transfer medium and condensed water, and can also generate power. Thus, the energy efficiency thereof is extremely high.

Figure 4:
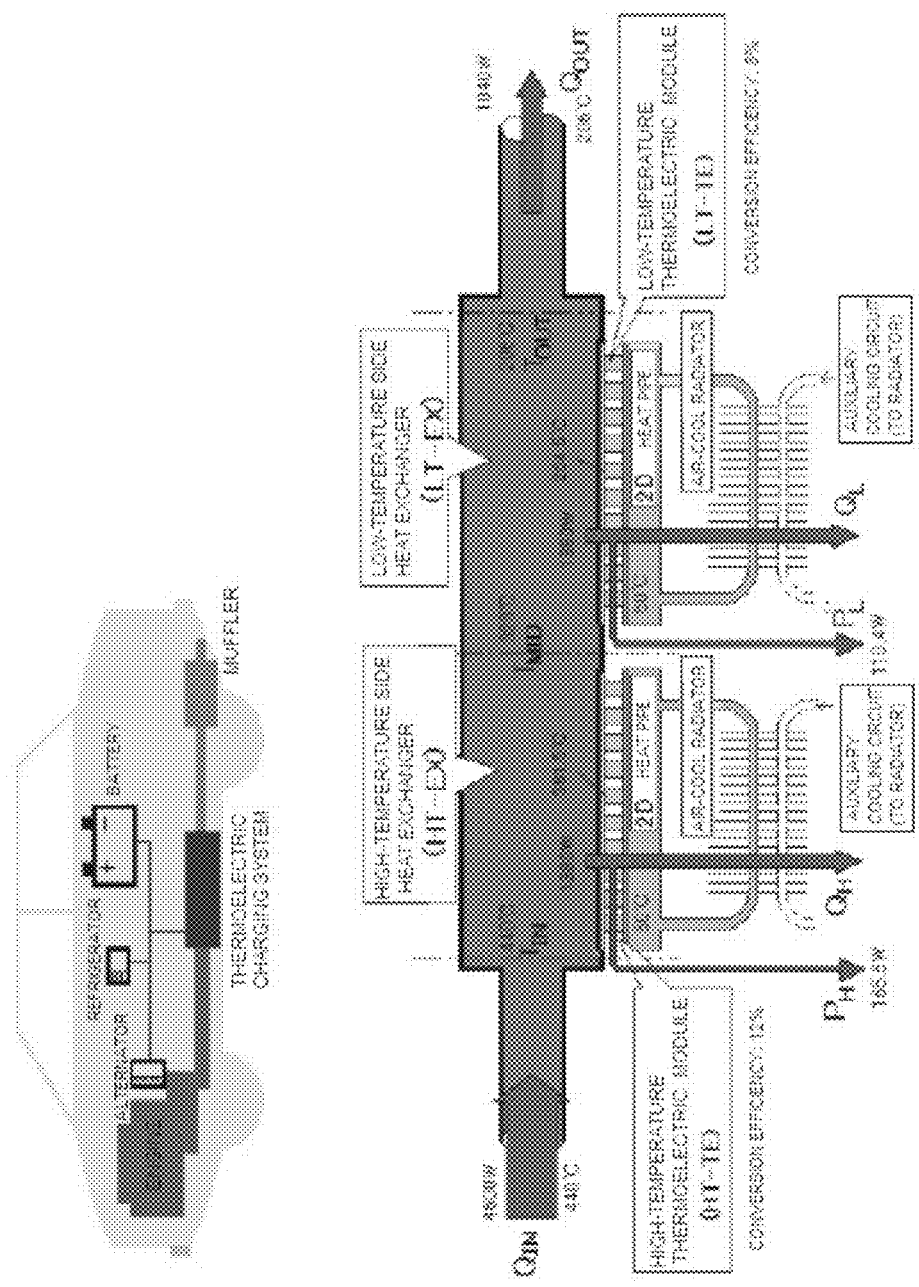
FIG. 4 is a schematic diagram of a known system.

Various systems for improving the energy efficiency have been proposed, besides the one that uses a steam generator. For example, a system shown in FIG. 4 is disclosed in a study of next-generation thermoelectric conversion technology (pp. 127 to 128) in a 2007 achievement report from the New Energy and Industrial Technology Development Organization. This system aims to reduce fuel cost by using thermoelectric elements to generate thermoelectric power from exhaust heat contained in automobile exhaust gas. However, in this system, the heat used for thermoelectric power generation indicated by $Q_H$ and $Q_L$ is wasted, as well as the heat of the exhaust gas indicated by $Q_{OUT}$. Accordingly, the system does not achieve sufficiently high energy efficiency. In contrast, in the system of the present embodiment, the efficiency of the heat removal from the heat source of the high temperature side (i.e., the heat source supply device 2) is increased when producing steam, and part of the heat transfer energy for producing steam is directly converted into electric energy by the thermoelectric element modules 4. Further, all of the heat energy contained in the produced steam is effectively used, thereby improving the energy efficiency of the entire system. Therefore, the system of the present invention can improve the energy efficiency further than the known systems.

An embodiment of the present invention is described above; however, the present invention is not limited to the above embodiment. Various changes may be made without departing from the scope of the present invention.

Figure 5:
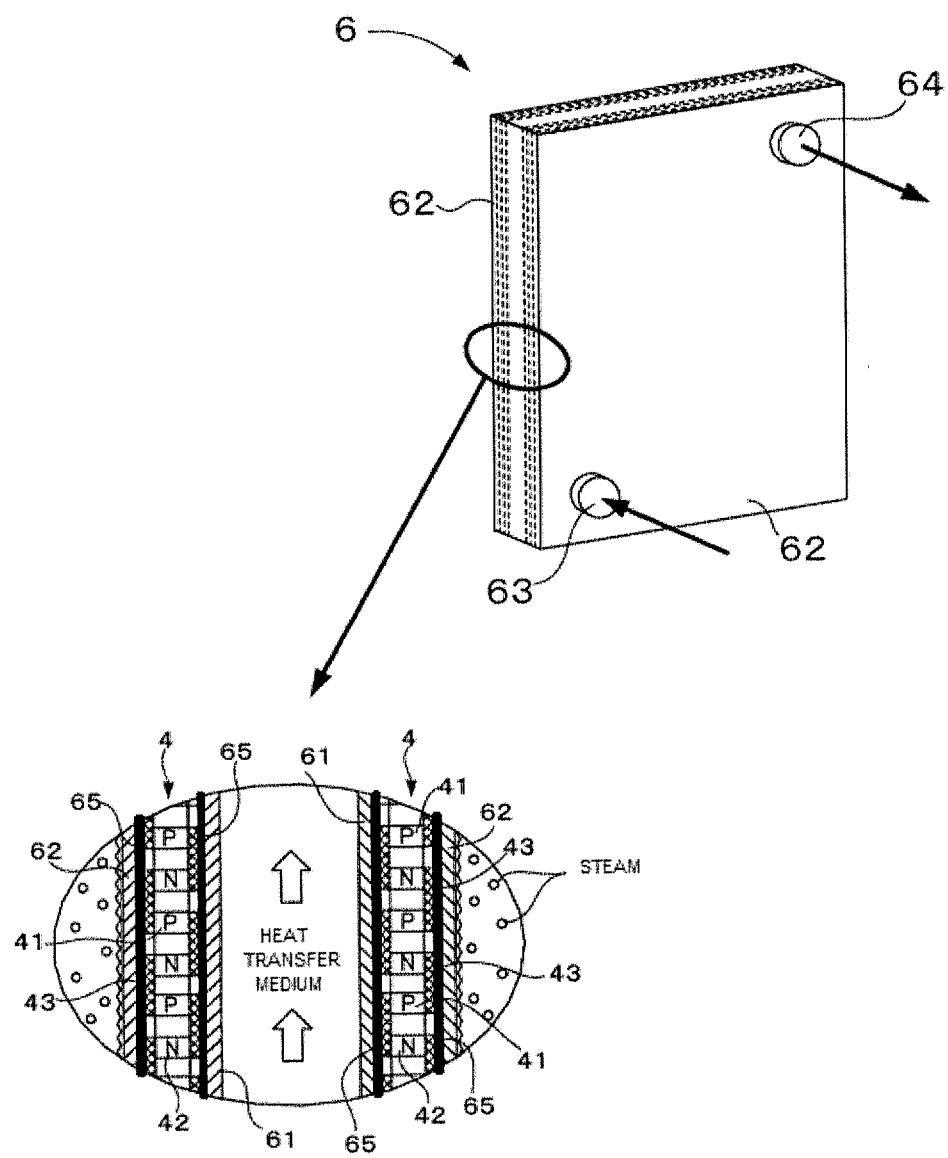
FIG. 5 is a perspective view and a partial cross sectional view of a plate-type heat exchanger that can be used in the present invention.

For example, in the above embodiment, the steam generator uses the pipe members 121 to perform heat exchange (pipe type); however, the method of heat exchange is not limited thereto, and various types of heat exchangers may be used. For example, a plate-type heat exchanger as shown in FIG. 5 may be used. As shown in FIG. 5, in the plate-type heat exchanger, a passage through which the high-temperature heat transfer medium passes is formed between a pair of high-temperature heat transfer plates 61, and the thermoelectric element module 4 and a low-temperature heat transfer plate 62 are arranged in that order on the outer side of each high-temperature heat transfer plate 61. As is the case described in the above embodiment, the thermoelectric element module 4 is formed by interconnecting the multiple p-type and n-type thermoelectric elements 41 and 42. Further, note that an insulation sheet 65 is arranged between the heat transfer plate 61 and the thermoelectric element module 4, and also between the heat transfer plate 62 and the thermoelectric element module 4. In this way, a heat transfer module 6 in which the above-described members are integrated is formed. The heat transfer module 6 has a supply port 63 and a discharge port 64 formed on the surface thereof for communicating with the passage therein. The high-temperature heat transfer medium is supplied from the supply port 63 to the passage in the module 6, and evaporated on the surface of the low-temperature heat transfer plate 62. At this time, power is generated in the thermoelectric element modules 4 due to the temperature difference between the heat transfer plates 61 and 62 on both sides. Subsequently, the heat-exchanged heat transfer medium is discharged from the discharge port 64. A necessary number of modules 6 are interconnected and mounted in the housing 11 shown in FIG. 1. As a result, an area required for generation of power and steam can be secured.

Further, in the above embodiment, the power generated in the thermoelectric element modules 4 is supplied to the outside of the system; however, it can be used to drive the steam generator 1, the heat source supply device 2, or the seawater desalination plant 3. At this time, when, for example, a device based on reverse osmosis (RO) other than the above-described steam method is employed as the seawater desalination plant 3, the power of the thermoelectric element modules 4 can be used to drive the device.

Various types of devices other than the one that uses solar heat as described may be used as the heat source supply device 2. In other words, the device is not particularly limited insofar as it can supply heat to the steam generator 1. For example, power plant boiler flue gas, furnace flue gas exhausted from a furnace such as a biomass furnace, a waste furnace, etc., waste heat from an incinerator, etc. can be used.

The steam generator 1 can also be made in various embodiments other than the above-described embodiment. In other words, the embodiment thereof is not particularly limited insofar as it includes a high-temperature chamber to which high temperature heat is supplied, a low-temperature chamber adjacent thereto to which water is supplied, and thermoelectric elements arranged between the high-temperature chamber and the low-temperature chamber. Accordingly, the device may be configured in such a manner that the low-temperature chamber can be directly heated from the high-temperature chamber without using a heat transfer medium. Note that, in the above embodiment, the passage 12 through which the heat transfer medium flows is the high-temperature chamber, and the internal space of the housing 11 in which steam is produced from water is the low-temperature chamber.

In the above embodiment, the solar collecting system 21 is used to heat the heat transfer medium. By increasing the size of the high-temperature tank 24 and the low-temperature tank 28, it is possible to operate the system even at night. For example, at night, the valve 271 of the supply pipe 27 and the valve 232 of the discharge pipe 23 are closed so as to prevent the supply of the heat transfer medium to the heat collecting portion 211. Further, the heat transfer medium is supplied overnight to the steam generator 1 from the high-temperature tank 24. The heat transfer medium that passes through the steam generator 1 is stored overnight in the low-temperature tank 28. Note that the low-temperature tank 28 is preferably maintained at a temperature at which the heat transfer medium will not solidify. On the other hand, the high-temperature tank is preferably maintained at as high a temperature as possible. However, when the temperature is too high, the heat transfer medium may decompose. Thus, the high-temperature tank is preferably maintained at around a temperature at which the heat transfer medium will not decompose. Further, during a period of time when the solar light can be used, the valves 271 and 232 are opened to heat the heat transfer medium by the solar collecting system 21, and the system is operated as described above. In this way, 24-hour operation of the system can be achieved.

Further, in the above embodiment, the seawater desalination plant 3 is described as an example that uses the low-temperature steam produced in the steam generator 1; however, the low-temperature steam can be used in other applications. For example, it can be used by a device such as a chemical heat pump, and can also be used in applications such as heating, drying, evaporating, etc.

EXAMPLES

Hereinbelow, Examples of the present invention are described. Note that the present invention is not limited to the following Examples.

Example 1

Figure 6:
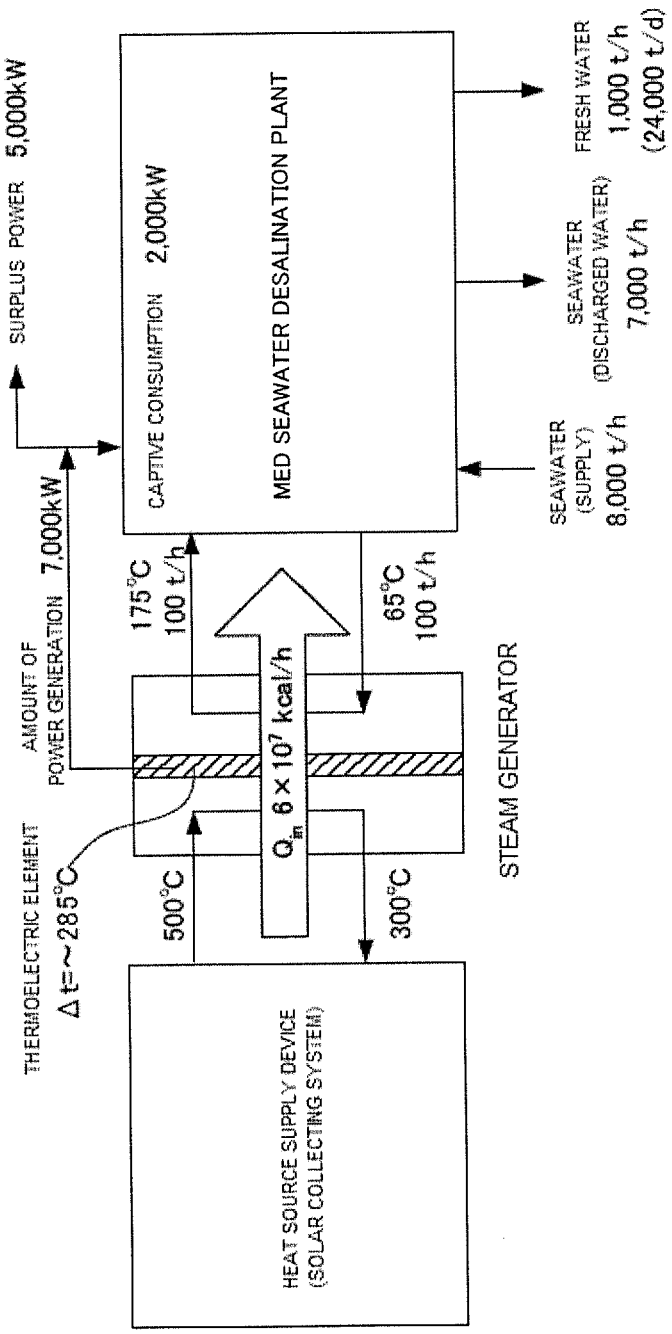
FIG. 6 is a schematic diagram of a system in Example 1.

FIG. 6 shows Example 1. This system uses a seawater desalination plant based on Multi Effect Desalination (MED). FIG. 6 shows an example of specific operating conditions of the system shown in FIG. 1. A heat transfer medium of 500° C. is supplied to the steam generator from the heat source supply device that uses a solar collecting system, and a heat transfer medium of 300° C. is returned to the heat source supply device. Further, steam of 175° C. is supplied to the MED seawater desalination plant from the steam generator, and condensed water of 65° C. is returned to the steam generator. Accordingly, the amount of heat supplied to the MED seawater desalination plant from the heat source supply device is about 6×107 kcal/h. In the steam generator, thermoelectric conversion is effected between heat of 500° C. and heat of 65° C., thereby generating power. Power of 7,000 kW is thereby generated. Of this power, 2,000 kW is consumed for driving the MED seawater desalination plant, and the remaining 5,000 kW is supplied as surplus power to the outside. In the MED seawater desalination plant, 8,000 t/h of seawater is supplied, and 1,000 t/h of fresh water is produced therefrom; and 7,000 t/h of seawater is discharged.

Example 2

Figure 7:
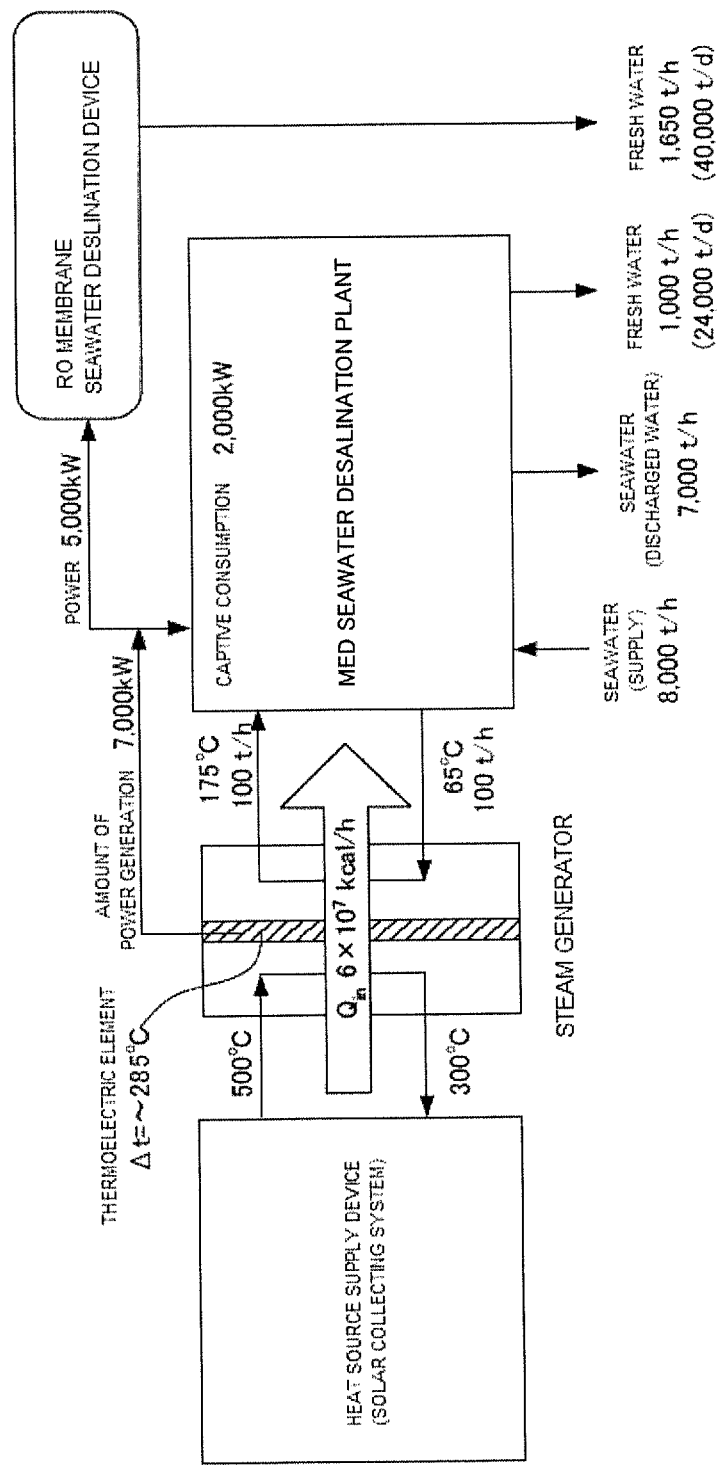
FIG. 7 is a schematic diagram of a system in Example 2.

Example 2 is different from Example 1 in that the former uses a reverse osmosis (RO) seawater desalination plant in addition to an MED seawater desalination plant. As shown in FIG. 7, specifically, 5,000 kW of power generated by the thermoelectric element modules is supplied to the RO membrane seawater desalination plant for a desalination process.

The above-described Examples are suitable for a continuous operation of the MED seawater desalination plant because the solar collecting system is used. Further, power can be obtained at high efficiency by integrating the thermoelectric elements into the steam generator, and steam in an amount sufficient to the MED seawater desalination plant can be simultaneously produced. Conventionally proposed systems that use power generated by a steam turbine require high-level techniques for maintenance. However, the use of the thermoelectric elements as in the present Examples results in a maintenance-free system, and allows desalination at high efficiency. Accordingly, the application of the systems of the present Examples to seawater desalination plants achieves an extremely good cost/performance ratio.

Example 3

Figure 8:
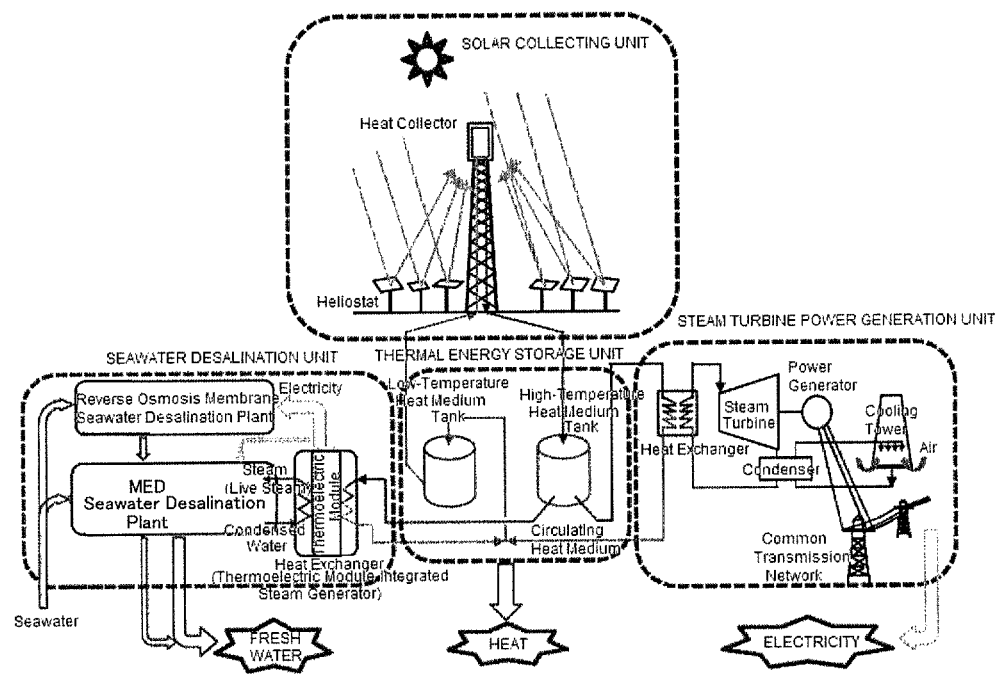
FIG. 8 is a schematic diagram of a system in Example 3.

The above-described energy supply system generates electricity using the thermoelectric elements. It is also possible, for example, to provide a separate power generation facility to thereby achieve large-scale power generation. FIG. 8 shows a comprehensive energy supply system capable of simultaneously supplying fresh water, heat, and electricity by adding a power generation facility to the system shown in FIG. 1. Specifically, this system consists of four units, i.e., a solar collecting unit, a seawater desalination unit, a thermal energy storage unit, and a steam turbine power generation unit. The solar collecting unit is the solar collecting system 21 shown in FIG. 3, and the seawater desalination unit is a plant based on the steam generator 1 and the seawater desalination plant 3 shown in FIG. 1. Further, the thermal energy storage unit is provided with the low-temperature tank 28 and the high-temperature tank 24 shown in FIG. 3. The relationship of these three units is as described above. Further, in addition to these three units, a steam turbine power generation unit for power generation is provided to the system.

This steam turbine power generation unit includes the following devices of the known type: heat exchanger, steam turbine, power generator, condenser, and cooling tower. The heat exchanger is supplied with a high-temperature heat transfer medium from the high-temperature tank of the thermal energy storage unit, and high-temperature steam that was heat-exchanged is supplied to the steam turbine. The high-temperature steam rotates the turbine, and the power generator is driven by the rotation energy. The thus-generated electricity is supplied to the outside through a common transmission network. The steam used to rotate the turbine is cooled into a liquid state in the condenser, and sent to the heat exchanger. Subsequently, this liquid is heat-exchanged with the high-temperature heat transfer medium in the heat exchanger, and, as described above, is sent as high-temperature steam to the steam turbine. Further, the high-temperature heat transfer medium is sent to the low-temperature tank of the thermal energy storage unit after heat exchange. Note that cooling water cooled by air in the cooling tower is sent to the condenser, and steam discharged from the steam turbine is condensed by the cooling water. Further, a gas turbine engine that uses fossil fuel as a heat source may be additionally arranged between the heat exchanger and the steam turbine. With the addition of such a gas turbine engine, power can be generated by the gas turbine engine, and the temperature of steam supplied by the steam turbine can be further increased, thus allowing introduction of a hybrid power generation system that aims to improve comprehensive efficiency.

The above energy supply system can provide basic social infrastructure, i.e., electricity, water, and heat, by adding a steam turbine power generation unit as described above to the system. Specifically, as described above, electricity can be supplied by the steam turbine power generation unit, and water can be supplied by the seawater desalination unit. Further, heat can be supplied from the low-temperature tank or the high-temperature tank of the thermal energy storage unit. For example, in the case of a system capable of generating 200 MW of power, 1.5 billion kWh/y of power and 60 million m³/y of freshwater can be concurrently generated. This is sufficient to meet the water demand of 50,000 people, and the electricity demand of 250,000 people.

Further, with the above-described system, a 24-hour continuous operation of the entire system can also be easily achieved by increasing the storage capacity for the heat transfer medium in the thermal energy storing process. A general solar collecting unit can collect light only when the unit is exposed to the sun in the daytime. In order to achieve a 24-hour continuous operation of the entire system, the unit is designed so as to collect all of the necessary energy from the light during solar insolation. Specifically, the energy necessary for the operation of the entire system per day is collected during periods of solar insolation, and the collected energy is primarily stored in the high-temperature tank of the thermal energy storage unit. Then, at night, the seawater desalination unit and the steam turbine power generation unit are driven by the heat transfer medium stored in the high-temperature tank. With such a system, it is possible to provide basic social infrastructure, i.e., electricity, water, and heat, in a completely $CO_2$ emission-free manner. Further, the thus-produced energy can be used not only in industries such as mining, agriculture, aquaculture, etc., but also in the living environment, for example for cooling, heating, cooking, etc.

REFERENCE SYMBOL LIST

1 Steam generator
11 Housing (low-temperature chamber)
12 Passage (high-temperature chamber)
2 Heat source supply device
21 Solar collecting system (solar collecting means)
3 Seawater desalination plant
4 Thermoelectric element module
41, 42 Thermoelectric element

The invention claimed is:
1. An energy supply system comprising:
a steam generator including:
a high-temperature chamber formed of a passage,
a low-temperature chamber surrounding the high-temperature chamber,
at least one thermoelectric element arranged between the high-temperature chamber and the low-temperature chamber, the thermoelectric element generates power by a temperature difference between the high-temperature chamber and the low-temperature chamber,
a heat transfer medium in a liquid state at a temperature of 250° C. to 800° C. passes through the high temperature chamber and transmits heat to the low temperature chamber,
water provided in the low-temperature chamber, the water being heated by the heat transmitted to the low-temperature chamber from the heat transfer medium to produce a low temperature steam of 50° C. to 185° C.,
a steam duct being connected to the low-temperature chamber and for supplying the produced low temperature steam to the outside, and a heat source supply device that supplies the heat transfer medium to the high-temperature chamber, the heat source supply device uses solar heat to heat the heat transfer medium.

2. The energy supply system according to claim 1, wherein
the system is configured to circulate the heat transfer medium between the heat source supply device and the high-temperature chamber, and
the heat source supply device is capable of heating the heat transfer medium that is returned thereto from the high-temperature chamber.

3. The energy supply system according to claim 1, further comprising a first heat exchanger to which the low-temperature steam is supplied and in which heat exchange is performed using the low-temperature steam.

4. The energy supply system according to claim 3, wherein electricity generated by the thermoelectric element is supplied to the first heat exchanger.

5. The energy supply system according to claim 3, wherein the first heat exchanger produces water from the low-temperature steam by heat exchange, and supplies the water to the low-temperature chamber of the steam generator.

6. The energy supply system according to claim 3, wherein the first heat exchanger is a seawater desalination plant that desalinates seawater.

7. The energy supply system according to claim 6, further comprising a reverse osmosis (RO) seawater desalination plant that desalinates seawater using a reverse osmosis method, wherein
electricity generated by the thermoelectric element is supplied to the seawater desalination plant and the reverse osmosis (RO) seawater desalination plant.

8. The energy supply system according to claim 1, wherein the heat source supply device comprises:
a low-temperature tank that stores the heat transfer medium that passes through the high-temperature chamber of the steam generator,
a solar collecting means that supplies solar heat to the heat transfer medium supplied from the low-temperature tank, and
a high-temperature tank that stores the heat-transfer medium heated by the solar collecting means and that supplies such heat transfer medium to the high-temperature chamber of the steam generator.

9. The energy supply system according to claim 8, further comprising:
a second heat exchanger G1 that produces steam by heat exchange with the heat transfer medium supplied from the high-temperature tank,
a steam turbine driven by the steam produced by the second heat exchanger, and
a power generator driven by the steam turbine.

10. The energy supply system according to claim 8, further comprising:
a first valve arranged on a supply pipe for supplying the heat transfer medium, the supply pipe connecting the low-temperature tank and the solar collecting means; and
a second valve arranged on a discharge pipe for discharging the heat transfer medium, the discharge pipe connecting the solar collecting means and the high-temperature tank, wherein
the first valve and the second valve are closed at night to prevent supply of the heat transfer medium to the solar collecting means, thereby supplying the heat transfer medium to the steam generator overnight.

\* \* \* \* \*